(12) United States Patent
Liles et al.

(10) Patent No.: US 8,456,929 B2
(45) Date of Patent: Jun. 4, 2013

(54) CIRCUITS, SYSTEMS, AND METHODS FOR DYNAMIC VOLTAGE LEVEL SHIFTING

(75) Inventors: Stephen Edward Liles, Apex, NC (US); Chiaming Chai, Chapel Hill, NC (US); Lakshmikant Mamileti, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 351 days.

(21) Appl. No.: 12/755,446

(22) Filed: Apr. 7, 2010

(65) Prior Publication Data
US 2011/0249518 A1 Oct. 13, 2011

(51) Int. Cl.
*G11C 7/00* (2006.01)
(52) U.S. Cl.
USPC .................................................. 365/189.11
(58) Field of Classification Search
USPC .................................................. 365/189.11
See application file for complete search history.

(56) References Cited

U.S. PATENT DOCUMENTS

| | | | |
|---|---|---|---|
| 4,910,713 A * | 3/1990 | Madden et al. | 365/189.11 |
| 5,774,411 A | 6/1998 | Hsieh et al. | |
| 5,933,386 A | 8/1999 | Walker et al. | |
| 6,696,878 B1 | 2/2004 | Haskin | |
| 6,842,043 B1 * | 1/2005 | Nguyen et al. | 326/68 |
| 7,034,572 B2 | 4/2006 | Kim et al. | |
| 7,053,657 B1 | 5/2006 | Peng | |
| 7,560,970 B2 | 7/2009 | Cook et al. | |
| 7,760,559 B2 * | 7/2010 | Campbell et al. | 365/189.11 |
| 2005/0285623 A1 * | 12/2005 | Jahan et al. | 326/68 |
| 2006/0273825 A1 | 12/2006 | Tanaka et al. | |
| 2007/0018819 A1 | 1/2007 | Streeb et al. | |

OTHER PUBLICATIONS

International Search Report and Written Opinion—PCT/US2011/031198, International Search Authority—European Patent Office—Aug. 4, 2011.

* cited by examiner

*Primary Examiner* — Hoai V Ho
*Assistant Examiner* — Pablo Huerta
(74) *Attorney, Agent, or Firm* — Nicholas J. Pauley; Peter Michael Kamarchik; Joseph Agusta

(57) ABSTRACT

Dynamic voltage level shifting circuits, systems and methods are disclosed. A level shifting circuit comprises an input for accepting a first discrete voltage level to be shifted, a level shifting portion coupled to the input and to a second discrete voltage level, an enable portion having an enable input and coupled to the level shifting portion and an output. The level shifting circuit is configured to translate the data input at the first discrete voltage level into a second discrete voltage level. The enable portion is configured to selectively provide either the second discrete voltage level to the output or decouple at least a portion of the level shifting portion from the output based on the enable input.

24 Claims, 7 Drawing Sheets

CIRCUITS, SYSTEMS, AND METHODS FOR DYNAMIC VOLTAGE LEVEL SHIFTING

BACKGROUND

1. Field of the Disclosure

The technology of this disclosure relates generally to voltage level shifting circuits, and specifically to level shifting circuits providing dynamic voltage level shifting.

2. Background

Integrated circuits used in devices where power consumption is a concern may include a plurality of disparate voltage domains. In order for the different voltage domains to interoperate, voltage level shifting circuits may be employed. Generally, level shifting circuits receive a discrete input voltage and translate it to a discrete output voltage.

Level shifting circuits may employ one or more bias voltages in order to facilitate translation from one supply voltage to another. U.S. Pat. No. 7,053,657 illustrates such bias voltages pbias and pbias, substantially reproduced in FIG. 1, which may be distinct from the provided supply voltages Vint and Vext. The use of bias voltage(s) may increase the complexity of the overall design due to the need to generate and distribute the bias voltage(s).

Other conventional level shifting circuits may provide static voltage level shifting. U.S. patent application No. 2007/0188194 illustrates an exemplary static level shifting circuit substantially reproduced in FIG. 2. A signal from a first voltage domain having a voltage supply Vdd appearing at input IN is provided to the level shifting circuit, which produces a level shifted representation of that input in a second voltage domain having a voltage supply Vpp. For some applications, it would be desirable to isolate the output of the level shifter from transitions on the input of the level shifter. For instance, in the case of a write bit line driver circuit in a memory having shared dynamic read and write bit lines, the bit lines may need to be able to decouple from ground (i.e. "float") so that they can be precharged. A static level shifting circuit coupled to the bit lines would hold the bit lines in complementary logic states and would propagate any changes on the data input to the bit lines, which could interfere with read and write operations in the memory.

SUMMARY OF THE DISCLOSURE

Embodiments disclosed in the detailed description include dynamic voltage level shifting circuits, systems and methods that can provide a level shifted representation as an output or present a high impedance state. The disclosed circuits, systems and methods may provide interoperability with circuits having dynamic node, for example in memory systems having a shared read and write bit line. The disclosed circuits, systems and methods may provide such interoperability concurrent with acceptable levels of silicon area and power consumption.

In one exemplary embodiment, a level shifting circuit comprises a data input for accepting a first discrete voltage level to be shifted, a level shifting portion coupled to the input and to a second discrete voltage level, an enable portion having an enable input and coupled to the level shifting portion and an output. The level shifting circuit is configured to translate the data input at the first discrete voltage level into a second discrete voltage level. The enable portion is configured to selectively provide either the second discrete voltage level to the output or decouple at least a portion of the level shifting portion from the output based on the enable input.

In another exemplary embodiment, a method of operating a memory comprises receiving a data input driven by a first supply at a level shifting circuit, receiving a signal at an enable input of the level shifting circuit which enables the level shifting circuit, driving a level-shifted representation of the data input by a second supply onto a bit line during a write operation. The method further comprises receiving a signal at the enable input of the level shifting circuit which decouples at least a portion of the level shifting circuit from the bit line during a read operation.

In another exemplary embodiment, a memory system comprises a plurality of columns in a first voltage domain and a plurality of level shifting circuits, each level shifting circuit of the plurality of level shifting circuit coupled to one of the columns of the plurality of columns. Each column comprises a plurality of bit cells each coupled to a pair of shared read and write bit lines. Each level shifting circuit has a pair of complementary data inputs, an enable input and a pair of complementary data outputs, where the pair of complementary data outputs are coupled to the pair of shared read and write bit lines. In response to a signal at the enable input enabling the level shifting circuit, the level shifting circuit is adapted to receive signals at the pair of complementary data inputs from a second voltage domain and provide a representation of the signals translated into the first voltage domain to the pair of shared read and write bit lines via the pair of complementary data outputs. In response to a signal at the enable input disabling the level shifting circuit, the level shifting circuit is adapted to decouple a portion of the level shifting circuit from the pair of shared read and write bit lines.

DETAILED DESCRIPTION

Figure 1:
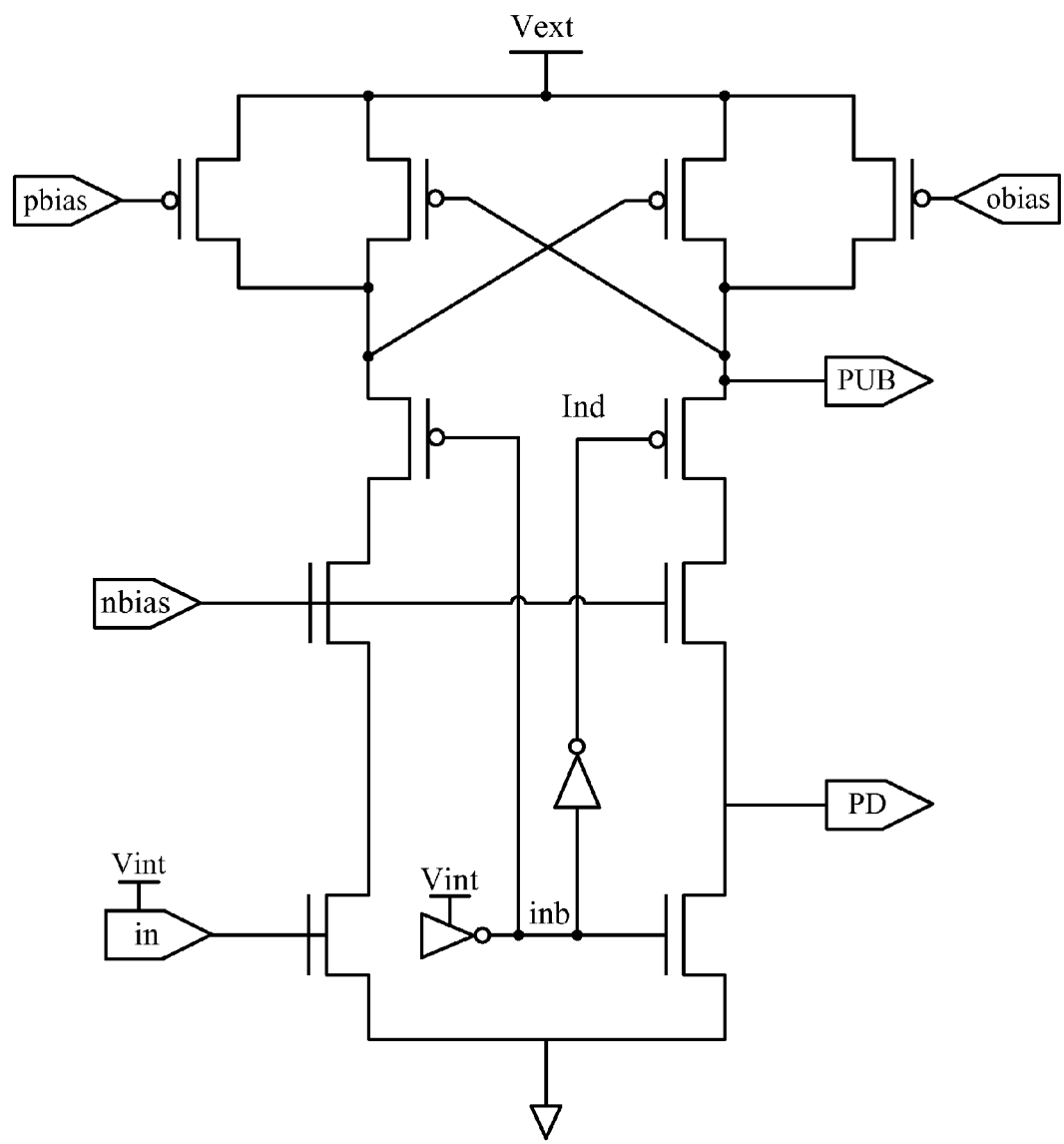
FIG. 1 is a schematic diagram of an exemplary level shifting circuit having a bias voltage.
Figure 2:
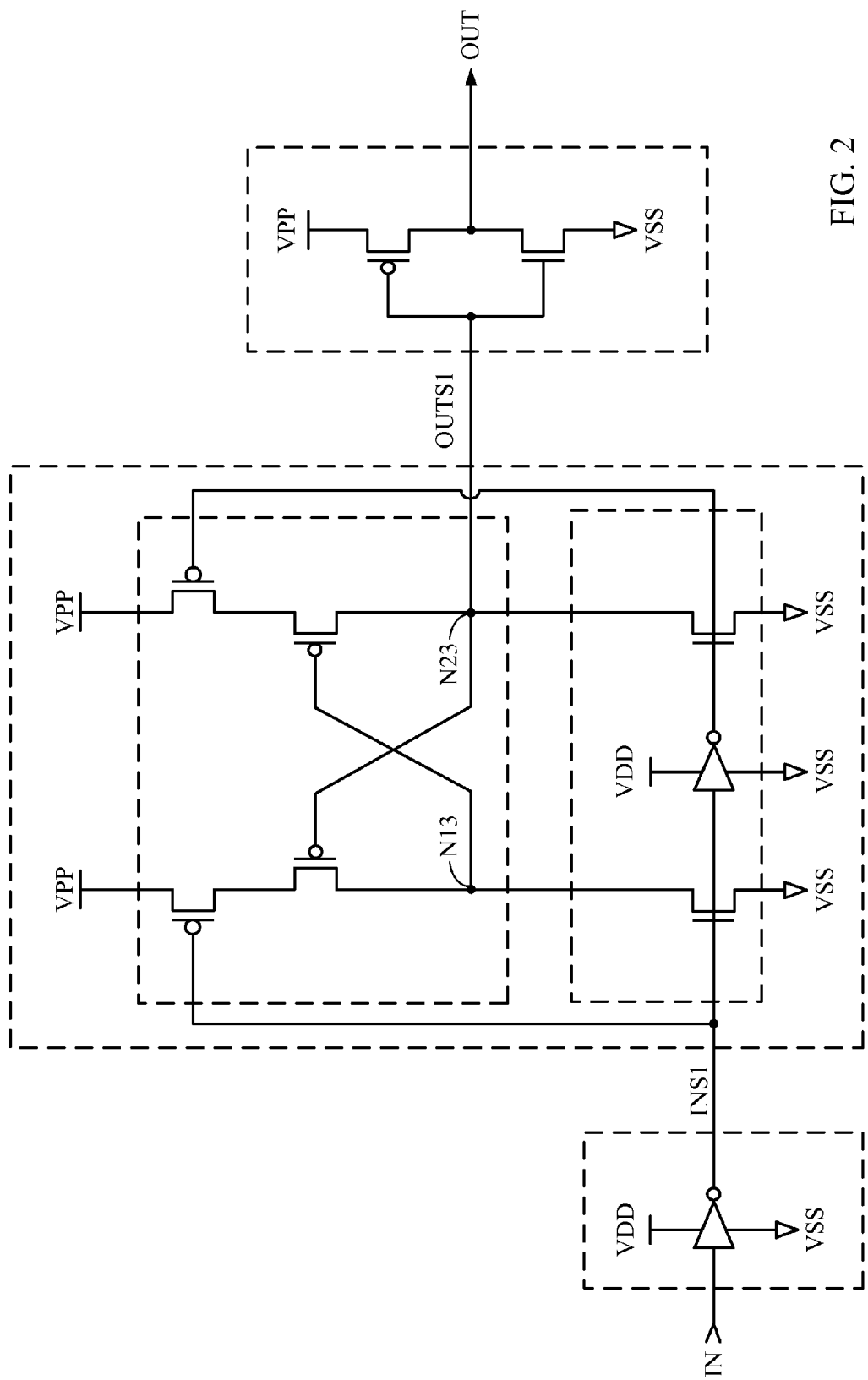
FIG. 2 is a schematic diagram of an exemplary conventional level shifting circuit providing static level shifting of a data input.
Figure 3:
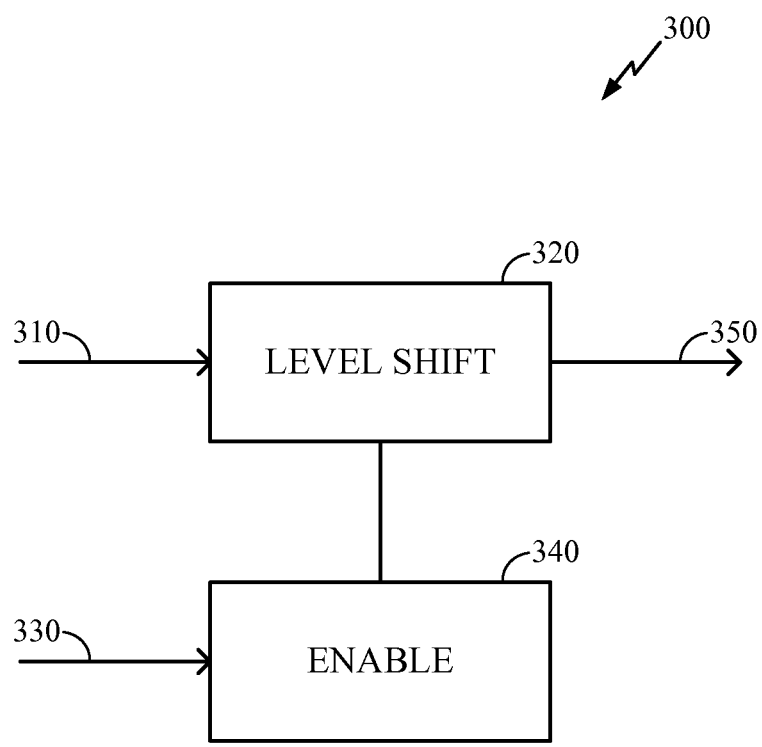
FIG. 3 is a block diagram of an illustrative dynamic voltage level shifting circuit.

FIG. 3 illustrates a high-level block diagram of a dynamic voltage level shifting circuit according to one embodiment, generally designated at 300. The dynamic level shifting circuit includes an input 310, a level shifting portion 320, an enable input 330, an enable portion 340 and an output 350.

The input 310 is coupled to the level shifting portion 320 and provides an input signal at a first discrete voltage level. The level shifting portion 320 translates the input signal at the first discrete voltage level into a second discrete voltage level which is different from the first discrete voltage level. For example, the first discrete voltage level may power circuits in a first voltage domain, and the second discrete voltage may power circuits in a second voltage domain.

The level shifting portion 320 is coupled to the enable portion 340. The enable portion 340 is configured to selectively provide the second discrete voltage level to the output 350 or to decouple at least a portion of the level shifting portion 320 from the output 350 based on the enable input 330.

Figure 4:
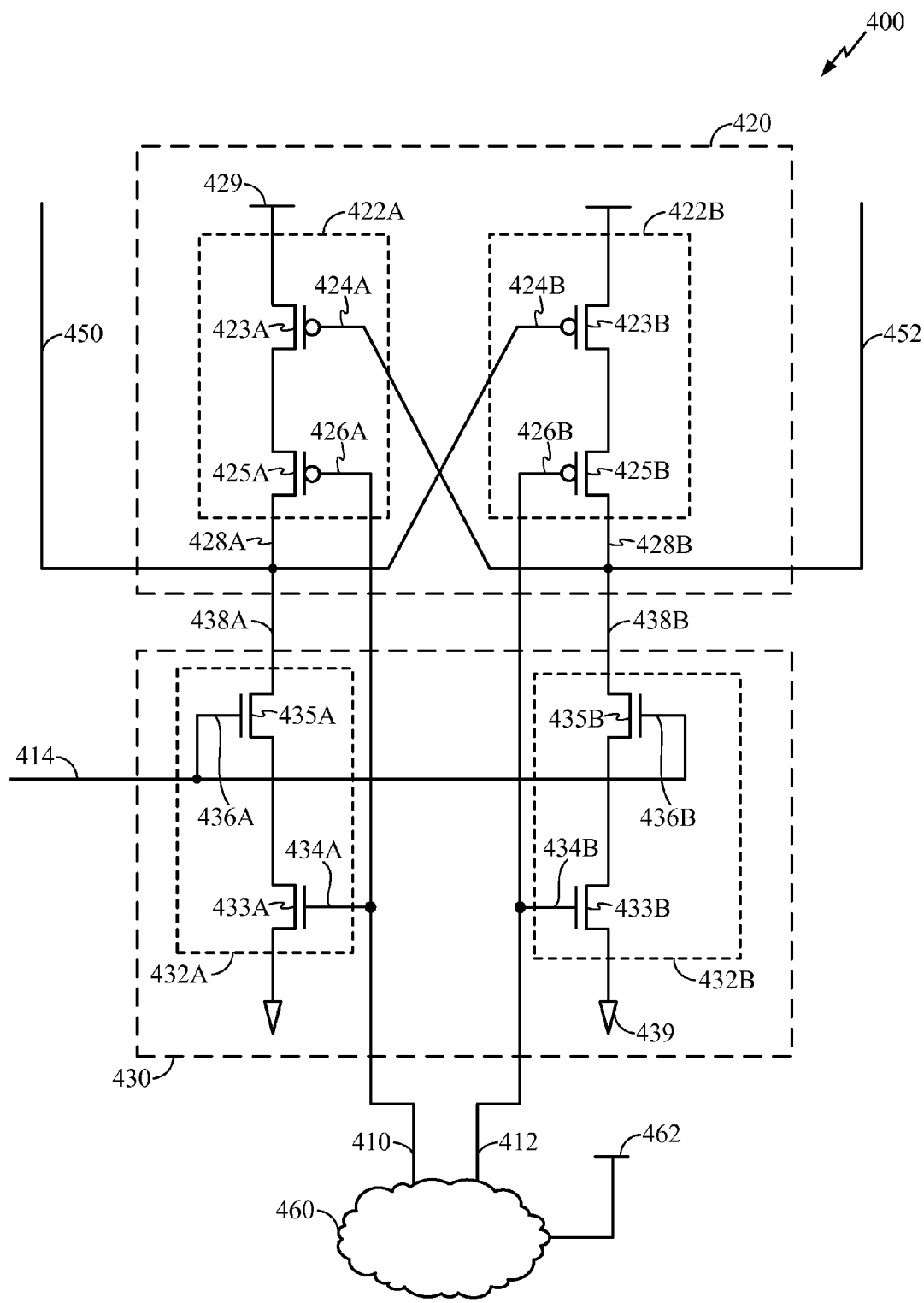
FIG. 4 is a schematic diagram of an illustrative dynamic voltage level shifting circuit.

FIG. 4 illustrates a dynamic voltage level shifting circuit, generally designated at 400 which includes a data input 410, a complement data input 412 and a level shift enable input 414. The level shifter circuit 400 further includes a pull-up section 420 coupled to a first supply 429 and an evaluation section 430 coupled to ground 439. The level shifter circuit 400 includes a complement data output 450 and a data output 452. The data input 410 and the complement data input 412 are driven by a circuit 460 coupled to a second supply 462.

The pull-up section 420 is configured to couple the couplement data output 450 and the data output 452 to the second supply 462 in response to the data input 410 and complement data input 412. With continuing reference to FIG. 4, the pull-up section 420 comprises a first pull-up circuit 422A and a second pull-up circuit 422B. In the illustrated embodiment, the first pull-up circuit 422A is comprised of a feedback PMOS transistor 423A, a feedback input 424A, a data input PMOS transistor 425A, a data input 426A and a pull-up output 428A. The feedback PMOS transistor 423A and the data input PMOS transistor 425A are coupled in series between the first supply 429 and the pull-up output 428A. The second pull-up circuit 422B is comprised of a feedback PMOS transistor 423B, a feedback input 424B, a data input PMOS transistor 425B, a data input 426B and a pull-up output 428B. The feedback PMOS transistor 423B and the data input PMOS transistor 425B are coupled in series between the first supply 429 and the pull-up output 428B. The data input 410 is coupled to the data input 426A of the first pull-up circuit 422A. The complement data input 412 is coupled to the data input 426B of the second pull-up circuit 422B. The pull-up output 428A of the first pull-up circuit 422A is coupled to the feedback input 424B of the second pull-up circuit 422B, and the pull-up output 428B of the second pull-up circuit 422B is coupled to the feedback input 424A of the first pull-up circuit 422A. Those skilled in the art will recognize that other configurations of the pull-up section 420 are possible. For example, the feedback PMOS transistors 423A and the data input PMOS transistors 425A could be interchanged as could 423B and 425B.

The evaluation section 430 is configured either to provide a complementary level-shifted representation of the data input 410 and complement data input 412 at the complement data output 452 and the data output 450 by coupling one of the complement data output 450 and the data output 450 to the ground 439 when enabled, or to present a high impedance to the complement data output 450 and the data output 452 when not enabled. With continuing to FIG. 4, the evaluation section 430 comprises a first evaluation circuit 432A and a second evaluation circuit 432B. The first evaluation circuit 432A is comprised of a data input NMOS transistor 433A, a data input 434A, an enable NMOS transistor 435A, an enable input 436A and an evaluation output 438A. The data input NMOS transistor 433A and the enable NMOS transistor 435A are coupled in series between the ground 439 and the evaluation output 438A. The second evaluation circuit 432B is comprised of a data input NMOS transistor 433B, a data input 434B, an enable NMOS transistor 435B, an enable input 436B and an evaluation output 438B. The data input NMOS transistor 433B and the enable NMOS transistor 435B are coupled in series between a ground 439 and the evaluation output 438B. The data input 410 is coupled to the data input 434A of the first evaluation circuit 432A. The complement data input 412 is coupled to the data input 434B of the second evaluation circuit 432B. The enable inputs 436A and 436B couple the level shift enable input 414 to enable NMOS transistors 435A and 435B, and allow the level shifting circuit 400 to isolate spurious logic low to logic high transitions on the data input 410 and complement data input 412 from the data output 452 and the complement data output 450.

Those skilled in the art will recognize that other configurations of the evaluation section 430 are possible. For example, in evaluation circuits 432A and 432B, the order of the data input NMOS transistors 433A and the enable NMOS transistors 435A could be interchanged, as could 433B and 435B. Alternatively, each evaluation circuit 432A and 432B could comprise a single NFET controlled by an AND gate, wherein in the first evaluation circuit the AND gate combines the data input 410 and the enable input 414 and in the second evaluation circuit the AND gate combines the complement data input 412 and the enable input 414.

In order to form the data output 452, the pull-up output 428B of the second pull-up circuit 422B and the evaluation output 438B of the second evaluation circuit 432B are coupled together. To form the complement data output 450, the pull-up output 428A of the first pull-up circuit 422A and the evaluation output 438A of the first evaluation circuit 432A are coupled together. Those skilled in the art will recognize that although the outputs of the level shifting circuit 400 are described as the data output 452 and the complement data output 450, the logic values of the data output 452 and the complement data output 450 are not always complementary. For example, during a precharge period, both the data output 452 and the complement data output 450 may both precharge to a logic high value. The data output 452 and the complement data output 450 may subsequently evaluate to complementary logic values in response to the data input 410 and the complement data input 412 when the level shifting circuit 400 is enabled.

With continuing reference to FIG. 4, when a logic high signal is received at the level shift enable input 414, the level shifting circuit 400 receives data and complement data inputs driven by the second supply voltage at data input 410 and complement data input 412 and provides level shifted representations of the data inputs at the first supply voltage on the data output 452 and the complement data output 450. When a logic low signal is received at the level shift enable input 414, the evaluation section 430 of the level shifting circuit 400 is disabled, and the data output 452 and the complement data output 450 are able to be driven by other circuits without interference from the evaluation section 430 of the level shifting circuit 400.

Those skilled in the art will recognize that other configurations of the level shifting circuit 400 are possible. For example, each pull-up circuit could further include a third PMOS transistor coupled in series with the other two PMOS transistors and connected to a pull-up enable input. This would allow the level shifting circuit 400 to isolate spurious logic high to logic low transitions on the data input 410 and complement data input 412 from the data output 452 and the complement data output 450. Such a modified pull-up circuit could be used with the evaluation circuit 432 illustrated in FIG. 4. Additionally, the level shift enable input 414 or other enable inputs may be driven either by the first supply 429 or the second supply 462. The choice of supply may be influenced by various design considerations including but not limited to the tracking between devices in a memory coupled to the level shifters and the devices in the level shifter, power consumption and leakage of the devices coupled to the level shift enable input 414 or other enable inputs, and overall system topology and timing.

Figure 5:
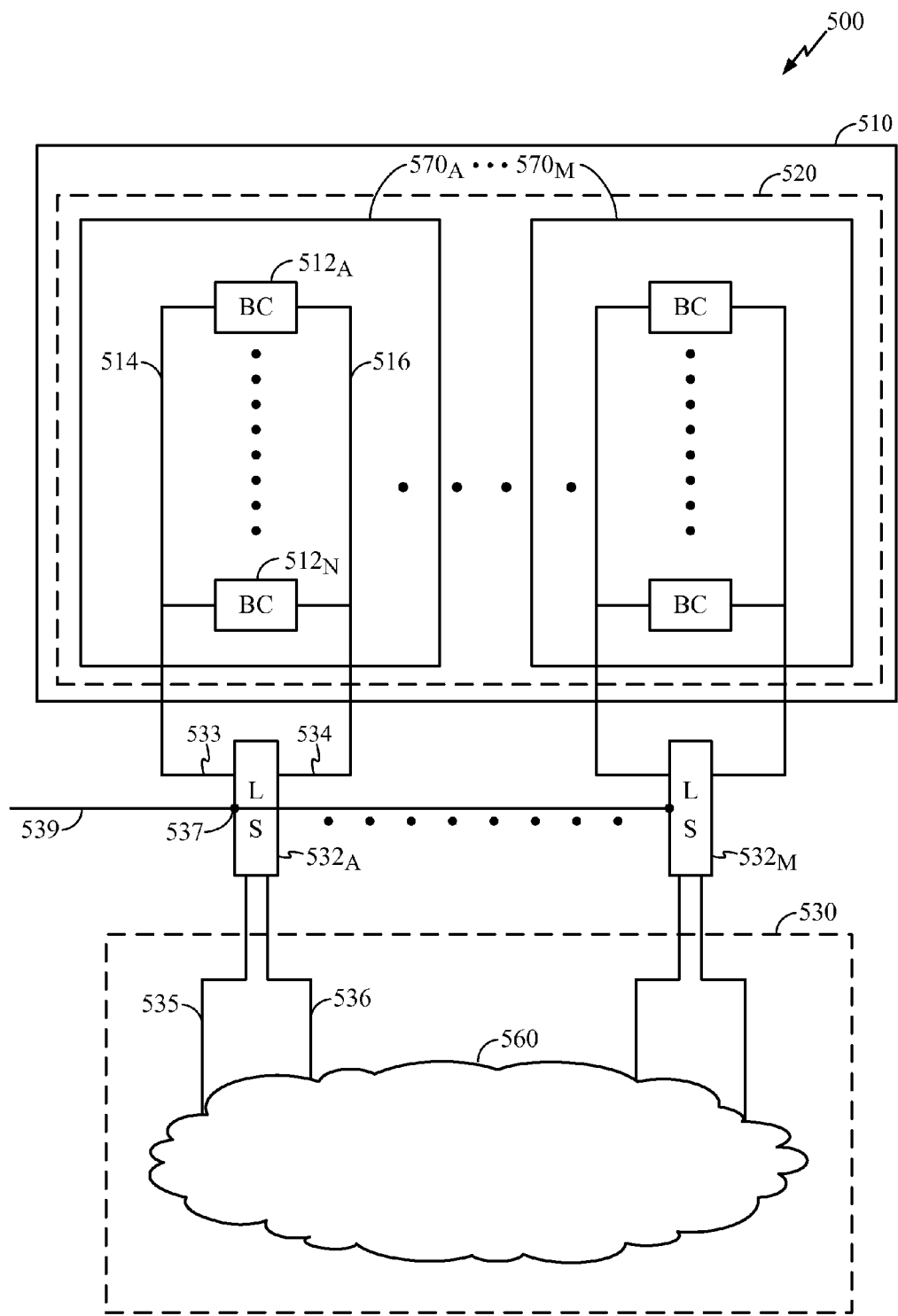
FIG. 5 is a block diagram of a memory system including a dynamic voltage level shifting circuit.

A dynamic voltage level shifting circuit substantially as described may be employed in a memory system to provide voltage level shifted signals to or from the memory system. In this regard, FIG. 5 illustrates a memory system 500 a memory 510 in a first voltage domain 520. The memory system 500 includes a plurality of dynamic voltage level shifting circuits shown at $532_A$-$532_M$. The memory 510 is coupled to a circuit 560 in a second voltage domain 530 through the plurality of dynamic voltage level shifting circuits $532_A$-$532_M$.

In the illustrated embodiment, the memory 510 is comprised of columns $570_A$-$570_M$. Each of columns $570_A$-$570_M$ is comprised of a plurality of memory bit cells $512_A$-$512_N$. Each memory bit cell $512_A$-$512_N$ is coupled to a pair of bit lines 514 and 516. Each pair of bit lines 514 and 516 is used during both read and write operations of the memory system 500. Each column $570_A$-$570_M$ is coupled to one of the plurality of level shifting circuits $532_A$-$532_M$ through the pair of bit lines 514 and 516.

Each level shifting circuit $532_A$-$532_M$ has an enable input 537, a data input 535 and complement data input 536 and a pair of complementary data outputs 533 and 534. In one embodiment, each level shifting circuit $532_A$-$532_M$ is substantially the same as that presented in FIG. 3. The data input 535 and complement data input 536 are coupled to the circuit 560 to receive data inputs from the second voltage domain 530. The pair of complementary data outputs 533 and 534 are coupled to the pair of bit lines 514 and 516 of each column $570_A$-$570_M$ respectively. In one embodiment, the enable input 537 of each level shifting circuit $532_A$-$532_M$ is coupled to a write clock 539. In other embodiments, the enable input 537 of each level shifting circuit $532_A$-$532_M$ may be tied to another type of enabling signal, or multiple enabling signals may be used.

During write operations, the write clock 539 is used to enable the level shifting circuits $532_A$-$532_M$, which translate the signals received via the data input 535 and complement data input 536 from the second voltage domain 530 and provide representations of those signals translated into the first voltage domain 520 via the complementary data outputs 533 and 534 onto the pairs of bit lines 514 and 516 for each column $570_A$-$570_M$. During read operations, the write clock 539 is used to disable the level shifting circuits $532_A$-$532_M$. This allows a value stored in one of the bit cells $512_A$-$512_N$ to be read out onto the pair of bit lines 514 and 516 without interference from the level shifting circuits $532_A$-$532_M$.

Figure 6:
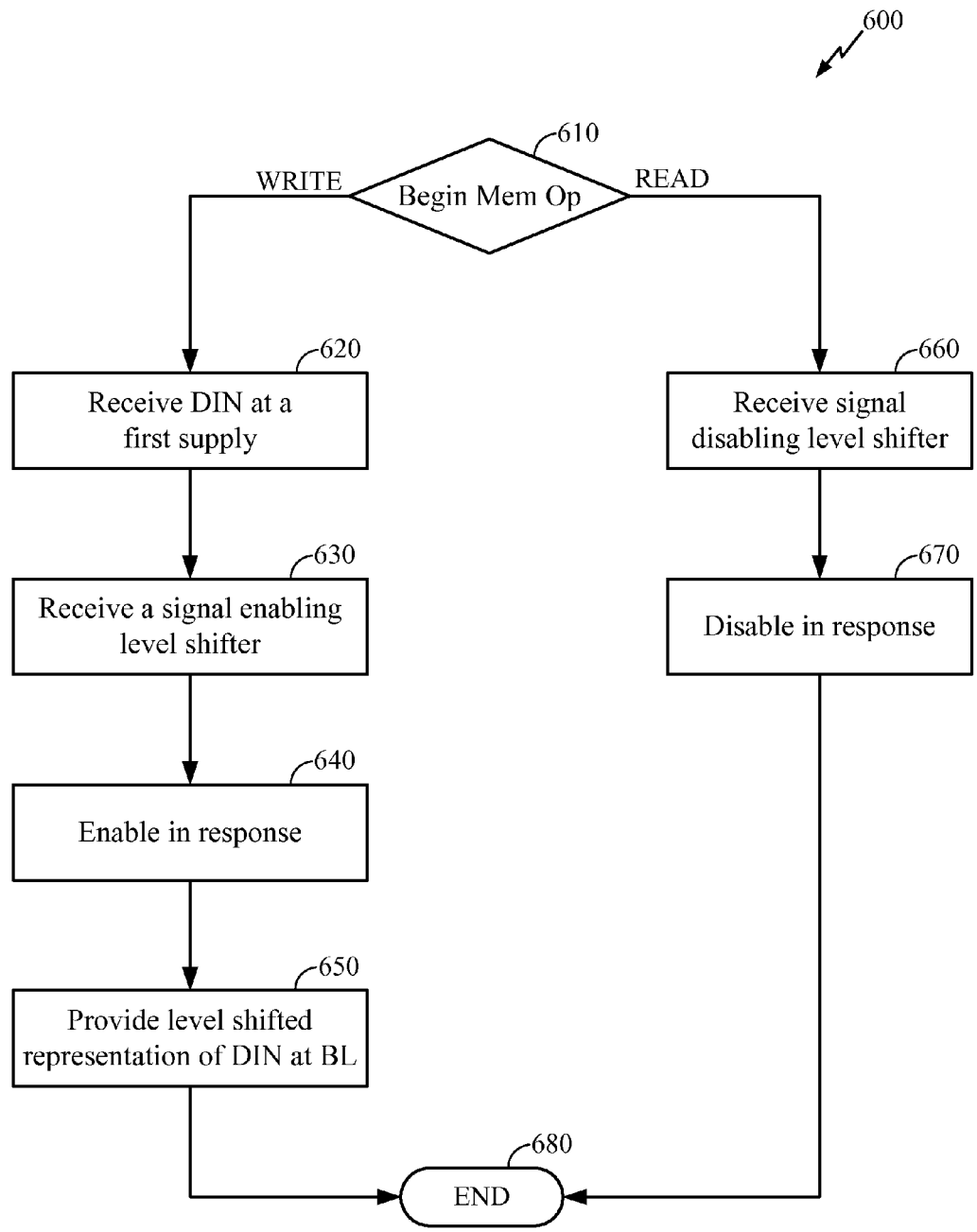
FIG. 6 is a flowchart illustrating a method of operating a dynamic voltage level shifting circuit.

Referring to FIG. 6, the operation of a dynamic voltage level shifting circuit is disclosed and generally designated at 600. The operation may be employed by the plurality of dynamic voltage level shifting circuits $532_A$-$532_M$ illustrated in FIG. 5, for example.

The method begins with the initiation of a memory operation at block 610. If the memory operation in block 610 is a write, proceed to block 620. At block 620, a data input at a first voltage supply level is received at a level shifting circuit. At block 630, the level shifting circuit receives a signal indicating that the level shifting circuit should be enabled. At block 640, the level shifting circuit is enabled in response to the signal. At block 650, the level shifting circuit provides a level shifted representation of the data input at a second voltage supply level at an output of the level shifting circuit. In one embodiment, the output of the level shifting circuit may be coupled to a shared dynamic read and write bit line of a memory, and the level shifting circuit may provide the level shifted representation of the data input to the shared dynamic read and write bit line. The method then ends at block 680.

If the memory operation in block 610 is a read, proceed to block 660. At block 660, the level shifting circuit receives a signal indicating that the level shifting circuit should be disabled. At block 670, the level shifting circuit is disabled in response to the signal. Disabling the level shifting circuit may include decoupling at least a portion of the level shifting circuit from the output of the level shifting circuit as described in reference to the embodiments described herein. The method then ends at block 680.

The level shifting circuit according to the designs and methods discussed herein may be included or integrated in a semiconductor die, integrated circuit, and/or device, including an electronic device and/or processor-based device or system. Examples of such devices include, without limitation, a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

Figure 7:
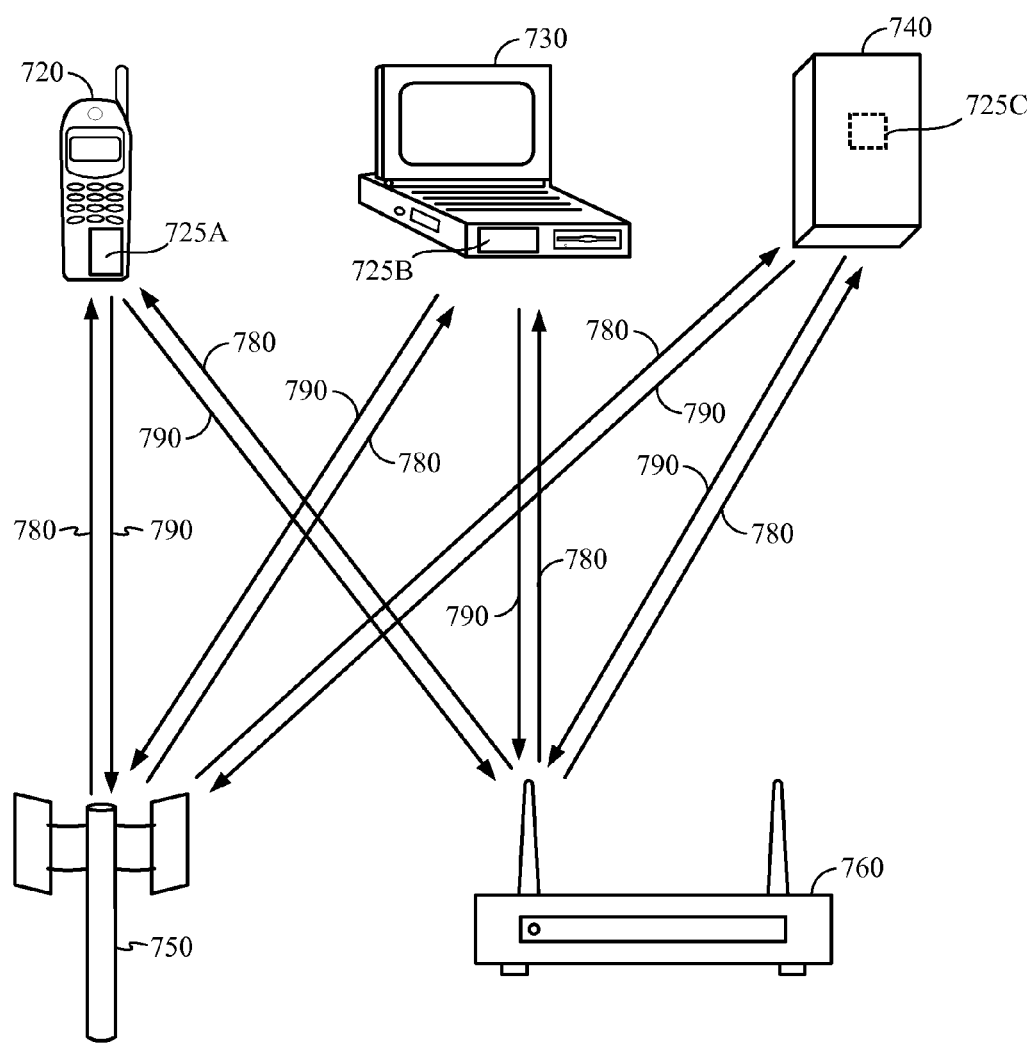
FIG. 7 is a graphical illustration of a system where a dynamic voltage level shifting circuit may be used.

FIG. 7 shows an exemplary wireless communication system 700 in which an embodiment of the disclosure may be advantageously employed. For purposes of illustration, FIG. 7 shows three remote units 720, 730, and 740 and two base stations 750, 760. It will be recognized that wireless communication systems may have many more remote units and base stations. The remote units 720, 730, and 740 include improved semiconductor devices 725A, 725B, and 725C, respectively, which in various embodiments include dynamic voltage level shifting circuits, as discussed above. FIG. 7 shows the forward link signals 780 from the base stations 750, 760 and the remote units 720, 730, and 740 and the reverse link signals 790 from the remote units 720, 730, and 740 to base stations 750, 760.

In FIG. 7, the remote unit 720 is shown as a mobile telephone, the remote unit 730 is shown as a portable computer, and the remote unit 740 is shown as a computer in a wireless local loop system. For example, the remote unit 720 may include mobile devices, such as cell phones, hand-held personal communication systems (PCS) units, portable data units such as personal data assistants. The remote unit 720 may also include fixed location data units such as meter reading equipment. Although FIG. 7 illustrates remote units according to the teachings of the disclosure, the disclosure is not limited to these exemplary illustrated units. The disclosure may be suitably employed in any device which includes level shifting circuits. Although specific circuitry has been set forth, it will be appreciated by those skilled in the art that not all of the disclosed circuitry is required to practice the disclosure. Moreover, certain well known circuits have not been described in order to maintain focus on the disclosure.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic level shifting circuit, comprising:
a data input for accepting from a first circuit driven by a first supply voltage a first discrete voltage level to be shifted;
a complement data input for accepting from the first circuit a second discrete voltage level;
a level shifting circuit coupled to the data input, the complement data input, and to a second supply voltage;
an enable circuit having an enable input and coupled to the level shifting circuit; and
an output and a complement output both separately coupled to the level shifting circuit and both separately coupled to the enable circuit;
wherein the first circuit is separate from the level shifting circuit and separate from the enable circuit,
wherein the level shifting circuit is configured to translate the data input and the complement data input at the first discrete voltage level into a third discrete voltage level on the output and the complement output in response to the enable input having an asserted voltage level during a write operation, and
wherein the enable circuit is configured to decouple at least a portion of the level shifting circuit from the output and the complement output in response to the enable input having a non-asserted voltage level during a read operation.

2. The dynamic level shifting circuit of claim 1, wherein:
the level shifting circuit comprises a first pull-up circuit and a second pull-up circuit, the first pull-up circuit having a first feedback input and a first pull-up output and being coupled to the data input and to the second supply voltage, the second pull-up circuit having a second feedback input and a second pull-up output and being coupled to the complement data input and to the second supply voltage; and
the enable circuit comprises a first evaluation circuit and a second evaluation circuit, the first evaluation circuit having a first evaluation output and being coupled to the data input and to ground, the second evaluation circuit having a second evaluation output and being coupled to the complement data input and to ground,
the first pull-up output is coupled to the second feedback input and the second pull-up output is coupled to the first feedback input;
the first pull-up output is coupled to the first evaluation output and the second pull-up output is coupled to the second evaluation output; and
the data input and the complement data input are separately driven by the first circuit driven by the first supply voltage.

3. The dynamic level shifting circuit of claim 2, wherein the first pull-up circuit and the second pull-up circuit each comprise a first PMOS transistor in series with a second PMOS transistor between the first supply voltage and the pull-up output, wherein the first PMOS transistor is coupled to the second supply voltage and to the pull-up output of the other pull-up circuit and the second PMOS transistor is coupled to one of the data input and complement data input.

4. The dynamic level shifting circuit of claim 2, wherein the first evaluation circuit and the second evaluation circuit each comprise a data input transistor, the gate of the data input transistor coupled to one of the data input and complement data input.

5. The dynamic level shifting circuit of claim 2, wherein the first evaluation circuit further comprises a first enable transistor and the second evaluation circuit further comprises a second enable transistor;
wherein the enable input is coupled to the first and second enable transistors;
wherein the first enable transistor is coupled between the first evaluation circuit and the first pull-up circuit; and
wherein the second enable transistor is coupled between the second evaluation circuit and the second pull-up circuit.

6. The dynamic level shifting circuit of claim 5, wherein the first evaluation circuit and the second evaluation circuit each comprise a data input transistor, the gate of the data input transistor coupled to one of the data input and the complement data input.

7. The dynamic level shifting circuit of claim 1, wherein the output is coupled to a first bit line of a pair of bit lines and the complement output is coupled to a second bit line of the pair of bit lines.

8. The dynamic level shifting circuit of claim 7, wherein the level shifting circuit is coupled to at least one memory cell through the pair of bit lines.

9. The dynamic level shifting circuit of claim 8, wherein the pair of bit lines are used during both the read and write operations of the at least one memory cell.

10. The dynamic level shifting circuit of claim 8, wherein the enable input is adapted to prevent the level shifting circuit from changing a state of either of the pair of bit lines during the read operation of the at least one memory cell.

11. The dynamic level shifting circuit of claim 1, wherein the enable input is adapted to be driven by the first discrete voltage level.

12. The dynamic level shifting circuit of claim 1, wherein the enable input is adapted to be driven by the second discrete voltage level.

13. The dynamic level shifting circuit of claim 1, wherein the enable input is a write clock.

14. The dynamic level shifting circuit of claim 1 integrated into a semiconductor die.

15. The dynamic level shifting circuit of claim 1, further comprising a device selected from the group consisting of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player, into which the level shifting circuit is integrated.

16. A method of operating a memory comprising:
during a write operation:
receiving a data input and a complement data input separately from a first circuit driven by a first supply at a level shifting circuit, wherein the first circuit is separate from the level shifting circuit;
receiving a signal at an enable input of the level shifting circuit which enables the level shifting circuit; and
driving a level-shifted representation of the data input and the complement data input by a second supply onto a pair of bit lines; and
during a read operation:
receiving a signal at the enable input of the level shifting circuit which disables and decouples at least a portion of the level shifting circuit from the pair of bit lines.

17. The method of claim 16, wherein the signal received at the enable input is driven by a first supply.

18. The method of claim 16, wherein the signal received at the enable input is driven by a second supply.

19. The method of claim 16, wherein the signal received at the enable input is a write clock.

20. A memory system comprising:
a plurality of columns in a first voltage domain; and
a plurality of level shifting circuits, each level shifting circuit of the plurality of level shifting circuits coupled to one of the columns of the plurality of columns;
wherein each column comprises a plurality of bit cells each coupled to a pair of bit lines,
wherein each level shifting circuit has a pair of complementary data inputs, an enable input and a pair of complementary data outputs, the pair of complementary data outputs coupled to the pair of bit lines,
wherein in response to a signal at the enable input having a first voltage level during a write operation, the level shifting circuit is adapted to receive signals at the pair of complementary data inputs from a first circuit driven by a second voltage domain and provide a representation of the signals translated into the first voltage domain to the pair of bit lines via the pair of complementary data outputs, the first circuit separate from the level shifting circuit, and
wherein in response to the signal at the enable input having a second voltage level during a read operation, at least a portion of the level shifting circuit is disabled and decoupled from the pair of bit lines.

21. The memory system of claim 20, wherein the enable input of each of the plurality of level shifting circuits is coupled to a write clock.

22. The memory system of claim 21, wherein the write clock is driven by the first voltage domain.

23. The memory system of claim 22, wherein the write clock is driven by the second voltage domain.

24. The memory system of claim 20, wherein the pair of bit lines are shared read and write bit lines.

* * * * *